United States Patent [19]

Ertl et al.

[11] 4,394,190
[45] Jul. 19, 1983

[54] MAGNETIC GATE AND METHOD OF PRODUCTION THEREOF

[75] Inventors: Wilhelm Ertl, Ottobrunn; Ulrich Lachmann; Heinrich Pertsch, both of Munich, all of Fed. Rep. of Germany

[73] Assignee: Siemens Aktiengesellschaft, Berlin and Munich

[21] Appl. No.: 225,686

[22] Filed: Jan. 16, 1981

[30] Foreign Application Priority Data

Jan. 18, 1980 [DE] Fed. Rep. of Germany ....... 3001771

[51] Int. Cl.$^3$ ............................................. H01L 43/06
[52] U.S. Cl. .................................. 148/31.55; 307/309
[58] Field of Search ..................... 357/27; 73/DIG. 3; 310/DIG. 3; 307/200, 309; 335/205; 338/32 H; 148/1, 31.55

[56] References Cited

U.S. PATENT DOCUMENTS 4,156,820  5/1979  Fukuda et al. ............... 338/32 H X Primary Examiner—L. Dewayne Rutledge
Assistant Examiner—David A. Hey
Attorney, Agent, or Firm—Herbert L. Lerner; Laurence A. Greenberg

[57] ABSTRACT

Magnetic gate, including a magnet having a magnetic pole with an at least partly flat surface, a semiconductor chip having an integrated circuit, a mechanically permeable metal piece, and means attaching the semiconductor chip to the magnetically permeable metal piece for minimizing mechanical stresses acting on the chip to eliminate piezo effects and method of production thereof.

4 Claims, 1 Drawing Figure

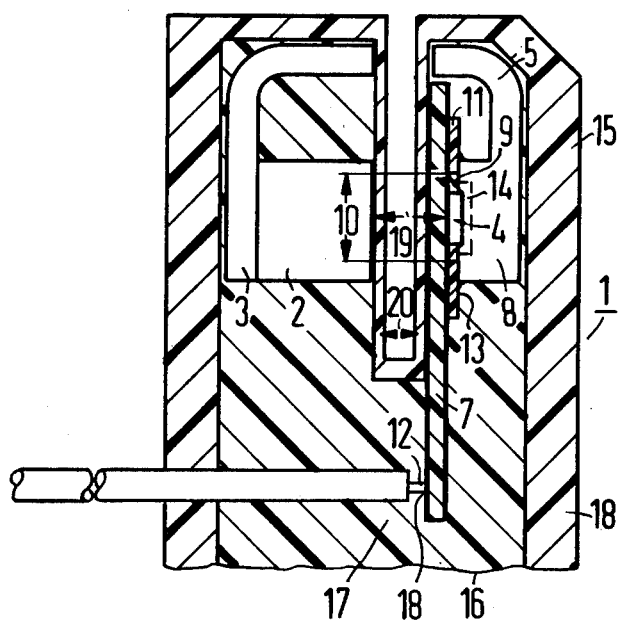

MAGNETIC GATE AND METHOD OF PRODUCTION THEREOF

The invention relates to a magnetic gate formed on the one hand of a magnet having one magnetic pole shaped in such a way that at least a part of its surface is flat, and on the other hand of a semiconductor chip which is provided with an integrated circuit.

It has been tried in the past to produce magnetic gates of the above-described type by applying a silicon chip having an integrated circuit onto a ceramic substrate by means of so-called flip-chip technology, i.e. in particular by means of soft bumps or raised areas, and to cap it with a cover. Conductive circuits provided on the ceramic substrate lead to the bumps of the silicon chip on on the one hand, and are provided with soldered connecting wires at the edges of the ceramic substrate. A magnet and the silicon chip are assembled into a prefabricated housing in such a manner that a flat portion of a magnetic pole runs parallel to the two largest surface portions of the silicon chip, and that the silicon chip is disposed at the same height as the parallel magnetic pole surface area. Furthermore, a magnetically permeable metal piece for the magnetic flow is placed into the prefabricated housing, disposed opposite the cover of the silicon chip, and porvided there with a raised portion. The magnet used is formed of Alnico.

The housing used is provided with side slits which are parallel to the ceramic substrate plate. During the subsequent operation with a plastic compound, these slits must be covered first, which creates technical difficulties, and requires additional work efforts.

Using a ceramic plate which also forms a part of the surface of the outer housing wall, and is connected by the plastic cast with the rest of the housing, frequently forms cracks at the connecting regions due to the different thermal expansion coefficients of the various materials used, so that such magnetic gates have no reliable corrosion protection.

Finally using a ceramic plate of 0.6 mm thickness in the hereinafore-described way also leads to a relative large gap width between the magnet and the semiconductor chip which results in disadvantageous and undesired increases of the dimensions of such a component.

Magnetic gates of the hereinafore-described type have a number of disadvantages. They have poor mechanical strength. Furthermore, the positioning of the ceramic substrate, i.e. also of the silicon chip, with respect to the position of the magnet and the magnetically permeable metal piece, is not reliable. This results in faulty fluctuations of the magnetic flux in the silicon chip causing defective functioning of the magnetic gate. By the thus described construction, the gap between the magnetic pole on the one hand, and the silicon chip on the other hand, is wide, approximately 3 mm, and the gap between the silicon chip and the gap between the silicon chip and the magnetically permeable metal piece is also large, approximately 0.8 mm. These large gap widths cause a low magnetic flow. In order to achieve a sufficient, stable magnetic flux, the magnet used must be correspondingly large. Large gap widths and large magnets result in a certain minimum size of the magnetic gates produced according to this method. However, in certain applications, large magnetic gates can be used only accepting disadvantages, or they are not applicable at all. Furthermore, the use of a ceramic substrate, disregarding poor reliability against shock and breakage, entails disadvantages in manufacturing. The work required to manufacture the device using ceramic substrates is considerable. Most of all the use of a ceramic substrate makes the automation of the manufacturing process of magnetic gates thus produced practically impossible.

It is accordingly an object of the invention to provide a magnetic gate and method of production thereof, which overcomes the hereinafore-mentioned disadvantages of the heretofore-known devices and methods of this general type and to describe a magnetic gate wherein piezo-effects(piezo-electric effects) are minimized.

With the foregoing and other objects in view there is provided, in accordance with the invention, a magnetic gate, comprising a magnet having a magnetic pole with an at least partly flat surface, a semiconductor chip having an integrated circuit, a mechanically permeable metal piece, and means attaching the semiconductor chip to the magnetically permeable metal piece for minimizing mechanical stresses or tensions acting on the chip to eliminate piezo effects.

When using semiconductor chips in which no measures are taken for compensation of piezo-effects, it is important to mount the semiconductor chip inside of the magnetic gate in such a manner so that it is, as much as possible, protected from external mechanical stresses acting upon it. This was achieved in the magnetic gate according to the invention by not fastening the chip directly onto a carrier or magnetically conducting metal piece, but by only securing a foil of synthetic material, such as Kaptonfoil, directly to the magnetically permeable metal. Meanwhile, the semiconductor chip is only connected to the synthetic material foil by means of fine contact-fingers, and otherwise is disposed so as to be freely floating in a recess formed in a specially shaped pole-shoe of the magnetically permeably metal piece.

In accordance with another feature of the invention, the magnetic pole is spaced from the semiconductor chip defining a gap therebetween being as small as possible. With the special construction form of the pole-shoe, and with the replacement of the heretofore conventionally used ceramic plate by an epoxy plate, it is possible on the one hand, to reduce the gap between the magnet and the semiconductor chip, because the epoxy plate has a thinner coating thickness, and on the other hand it is also possible to reduce the gap between the semiconductor chip and the pole-shoe at the magnetically conducting metal piece by giving the pole-shoe a suitable shape, so that an end-cap for the semiconductor chip is simultaneously formed.

In accordance with a further feature of the invention, the magnet is a samarium-cobalt magnet. Samarium-cobalt magnets have greater field strength than the conventionally used magnets of the same size, such as Alnico magnets. Furthermore, samarium-cobalt magnets retain their magnetic fieldstrength constant over long time periods, while for example with Alnico magnets the magnetic fieldstrength is not constant over longer time periods, so that components using them become unusable after a certain time. By using samarium cobalt magnets, a miniaturization of the thus produced magnetic gates can also be achieved.

In accordance with a concomitant mode of the invention, there is provided a method having a semiconductor chip, a thin intermediate carrier formed of synthetic materials, for example, having contact points, fingerlike structures, a magnetically permeable metal piece having a first part with a pole shoe having a cutout formed therein and a second part, a synthetic or plastic material plate having contact structures and external connecting wires connected at outer ends of the contact structures, and a pre-fabricated housing formed of synthetic material, for example, having an interior space formed therein, which comprises soldering the semiconductor chip as a miniaturized package to the intermediate carrier with the finger-like contact structures, attaching the intermediate carrier to the pole shoe, soldering the synthetic material plate to the corresponding contact points of the intermediate carrier, fastening the magnet to the first part of the magnetically permeable metal piece, separately inserting the magnet with the first part of the magnetically permeable metal piece, and the intermediate carrier connected to the second part of the magnetically permeable metal piece, the semiconductor chip and the synthetic plate into the pre-fabricated housing, and filling the interior space of the housing with a poured insulator formed of synthetic material, for example, covering the connection points between the external connecting wires and the synthetic plate.

The method has the advantage that the component is already functional before filling with the potting compound, so that in this state, various control measurements can be made, and defective or faulty assembled parts can already to detected and exchanged at this time, to keep the loss due to components that have to be scrapped as low as possible. This advantage is especially important in consideration of using the very expensive samarium cobalt magnets. A further advantage can be seen in the possibility of automating the manufacturing method.

Instead of assembling the first part of the permeable metal piece with its component, these two pre-assembled parts can also be secured by a suitable clamp, and can subsequently be sprayed with a synthetic material.

Other features which are considered as characteristic for the invention are set forth in the appended claims.

Although the invention is illustrated and described herein as embodied in a magnetic gate and method of production thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a fragmentary, diagrammatic cross-sectional view through a magnetic gate according to the invention.

Referring now particularly to the FIGURE of the drawing, it is seen that the Hall-magnetic gate 1 is formed of a magnet 2, formed of samarium-cobalt for example, which is cemented to a first part 3 of a magnetically permeable metal member, and a semiconductor chip 4 with an integrated circuit which is attached by means of finger-like contact structures 9 to an intermediate carrier 11, formed of Kapton for instance, so that the fingerlike structures 9 extend into a cut-out 10 formed in the intermediate carrier 11. In this way the semiconductor chip 4 is only fastened at the finger-like contact structures 9, and otherwise floats freely. The finger-like structures 9, on the one hand, are soldered to contacts at the semiconductor chip 4 which are not shown in the drawing, and on the other hand, they are soldered to contact points on the intermediate carrier 11 which are also not shown in the drawing. These contact points on the intermediate carrier 11 are in turn soldered to corresponding contact points of a plate 7 which are not shown in the drawing. The plate 7 is formed of synthetic material, for example of glass-fiber reinforced hard epoxy. From the contact points of the plastic plate 7 which are not shown in the drawing, contact structures that are also not shown lead along the surface of the plastic plate 7 to external connecting wires 12 with which they are conductively connected. Because the semiconductor chip 4 does not end flush with the surface 13 of the intermediate carrier 11, but extends beyond a surface 13 thereof, the pole-shoe 8 at the second part 5 of the permeable metal piece is provided with a recess 14 which ensures that the semiconductor chip 4 does not touch the pole-shoe 8 at any location. The first part 3 of the magnetically permeable metal piece is inserted into a prefabricated housing 15, formed of a synthetic material for example, and on the other hand the second part 5 of the magnetically permeable metal piece with the semiconductor chip 4, the intermediate carrier 11 and the plastic plate 7 with the soldered connecting wires 12 are inserted in the housing 15. The housing 15 is closed at all sides thererof with the exception of a surface 16. The interior space 17 of the housing is filled with an insulator, such as a synthetic material formed in particular of an epoxy casting compound, or epoxy bonding compound for example, in such a manner that it covers the connecting elements 18 between the external connecting wires 12 and the plastic plate 7. The size of the gap 19 between the semiconductor chip 4 and the magnet 2 is approximately 1.2 mm to 4.2 mm. and in particular between 2.2 mm and 3.2 mm.

A ferro-magnetic plate which is provided with cutouts rotates inside the gap 20 of the housing; this plate is not shown in the drawing and its function is to open and close the Hall-magnetic gate 1 according to the invention. During the potting of the interior space 17 of the housing, the synthetic compound fills all hollow spaces, so that the synthetic mass forms a loose connection between the semiconductor chip 4, on the one hand, and the pole-shoe 8 and the plastic plate 7, on the other hand.

Instead of using the housing 15 with the subsequent potting with synthetic material, the individual parts can also be assembled together, as described hereinafore in a holding fixture, made of aluminum, for example, and then sprayed with the synthetic material.

It is not essential to use a magnet which is a samarium cobalt magnet. Rather, one can also use another ferromagnetic material. The use of samarium cobalt magnets has the advantage that magnetic gates produced therewith have especially small dimensions compared with corresponding others. The magnetically permeable metal pieces 3 and 5 are formed of ferro-magnetic material.

The semiconductor chip can be formed of silicon, for example. However, it is not limited to this material. The use of silicon has the advantage that for this frequently used material many sophisticated technologies are available for its production and processing; this simplifies the construction and reduces the cost of the required components.

Magnetic gates according to the invention are used as position sensors with respect to translatory motions as well as for rotational motions, such as in machine tools as end position switches or in belt assembly lines to control the advance of the belt. Magnetic gates according to the invention can also be used for interrogation of coded parameters through the combination of several magnetic gates.

Finally, they can be used as non-contacting switches.

There is claimed:

1. Magnetic gate, comprising a magnetically permeable metal piece having first and second parts being spaced apart from each other, a pole shoe being integral with said second part of said metal piece and protruding toward said first part of said metal piece, a thin intermediate carrier being firmly connected to said pole shoe, finger-like contact structures integral with said intermediate carrier, a semiconductor chip having an integrated circuit being soldered to said finger-like contact structures, a synthetic material plate with contact structures being disposed on said intermediate carrier, outer junction wires being connected to outer ends of said contact structures of said synthetic material plate, a magnet being fastened to said first part of said metal piece and protruding toward said second part of said metal piece, said magnet having a magnetic pole with an at least partly flat surface being opposite said pole shoe and semiconductor chip defining an open space therebetween, said first and second parts of said metal piece being separated by the direct interposition of said magnet, open space, semiconductor chip and pole shoe, and synthetic insulation material embedding and fixing said metal piece, magnet and pole shoe in place.

2. Magnetic gate according to claim 1, including a prefabricated housing enclosing said metal piece, said synthetic insulation material filling said housing with the exception of said open space between said magnet and said semiconductor chip and pole shoe.

3. Magnetic gate according to claim 1, wherein said synthetic insulation material is epoxy resin.

4. Magnetic gate according to claim 1, wherein said magnet is a samarium-cobalt magnet.

* * * * *